(12) United States Patent
Yang

(10) Patent No.: US 12,213,283 B2
(45) Date of Patent: Jan. 28, 2025

(54) ELECTRONIC DEVICE AND CONTROL METHOD OF ELECTRONIC DEVICE

(71) Applicant: Beijing Xiaomi Mobile Software Co., Ltd., Beijing (CN)

(72) Inventor: Ruifu Yang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 451 days.

(21) Appl. No.: 17/587,986

(22) Filed: Jan. 28, 2022

(65) Prior Publication Data

US 2023/0026392 A1    Jan. 26, 2023

(30) Foreign Application Priority Data

Jul. 20, 2021    (CN) .......................... 202110818602.8

(51) Int. Cl.
*G06F 1/16*     (2006.01)
*H03K 3/017*    (2006.01)
*H05K 5/00*     (2006.01)
*H05K 7/00*     (2006.01)
*H05K 7/20*     (2006.01)

(52) U.S. Cl.
CPC ........... *H05K 7/2029* (2013.01); *H03K 3/017* (2013.01); *H05K 5/0086* (2013.01)

(58) Field of Classification Search
CPC ............. H05K 7/2029; H05K 7/20218; H05K 7/20209; H05K 7/20009; H05K 7/20381; H05K 7/20281; H05K 5/0086; H05K 5/0091; H03K 3/017; H03K 3/02; H03K 3/01
See application file for complete search history.

(56) References Cited

U.S. PATENT DOCUMENTS

| | | | |
|---|---|---|---|
| 2010/0052134 A1 | 3/2010 | Werner et al. | |
| 2010/0139290 A1* | 6/2010 | Leblond | H04N 23/661 454/251 |
| 2013/0271920 A1* | 10/2013 | Chun | H05K 7/2039 361/705 |
| 2015/0316246 A1* | 11/2015 | Sturla | F21V 29/70 362/373 |

(Continued)

OTHER PUBLICATIONS

Anonymous: "Thermoelectric cooling Wikipedia", Jun. 30, 2022 (Jun. 30, 2022), XP055940319, Retrieved from the Internet: URL: https://en. wikipedia. org/wiki/Thermoel ectric_cooling [retrieved on Jul. 8, 2022].

(Continued)

*Primary Examiner* — Anthony M Haughton
(74) *Attorney, Agent, or Firm* — Volpe Koenig

(57) ABSTRACT

An electronic device and a control method for controlling the electronic device is disclosed. The electronic device includes: a middle frame; a heat source mounted on the middle frame; a housing having a heat dissipation area and a non-heat-dissipation area, the heat source being located between the heat dissipation area and the middle frame, and a heat dissipation coefficient of the heat dissipation area being higher than that of the non-heat-dissipation area; and a processing module, configured to adjust heat dissipation power of the heat dissipation area according to a temperature of a non-contact position of the housing and a measured temperature of a contact position of the housing.

19 Claims, 6 Drawing Sheets

(56) References Cited

U.S. PATENT DOCUMENTS

| | | | |
|---|---|---|---|
| 2017/0115707 A1* | 4/2017 | Ho | G06F 1/203 |
| 2018/0035528 A1* | 2/2018 | Kim | H05K 9/0033 |
| 2019/0239396 A1* | 8/2019 | Hwang | H05K 7/20909 |
| 2020/0178415 A1* | 6/2020 | Kim | H05K 1/181 |
| 2020/0289314 A1 | 9/2020 | Smith et al. | |
| 2023/0195171 A1* | 6/2023 | Seo | H05K 7/20445 361/748 |

OTHER PUBLICATIONS

Extended European Search Report dated Jul. 20, 2022 for European Patent Application No. 22153879.6.

* cited by examiner

ELECTRONIC DEVICE AND CONTROL METHOD OF ELECTRONIC DEVICE

CROSS REFERENCE TO RELATED APPLICATION

The present application claims priority to Chinese patent Application No. 202110818602.8, filed on Jul. 20, 2021. The entire contents of the above-listed application are hereby incorporated by reference for all purposes.

BACKGROUND

With mobile phones as an example of electronic devices, a mobile phone of the 5th generation mobile communication technology (5G) has significantly higher power consumption than a mobile phone of the 4th generation mobile communication technology (4G), and 5G devices become hotter in use accordingly. Although the performance experience of a mobile phone is getting better, the user experience of the mobile phone is still degraded due to great heat generated by the mobile phone. At present, a mobile phone is cooled mainly through a graphite sheet, a copper tube, liquid cooling by a vapor chamber (VC), cooling by a metal middle frame, etc. These cooling methods are less than fully satisfactory to meet a demand from users for a better user experience. In some cases, the mobile phone itself will become hotter to the user's touch. In other words, temperatures of a rear housing, a middle frame, etc. of the mobile phone will greatly increase during use of the device, in which case the user's hand will feel hot upon touching the mobile phone, resulting in a poor experience for the user.

SUMMARY

The disclosure relates to the technical field of heat dissipation, and in particular to an electronic device and a control method of the electronic device.

According to an embodiment of a first aspect of the disclosure, there is provided an electronic device. The electronic device includes: a middle frame; a heat source mounted on the middle frame; a housing having a heat dissipation area and a non-heat-dissipation area, the heat source being located between the heat dissipation area and the middle frame, and a heat dissipation coefficient of the heat dissipation area being higher than that of the non-heat-dissipation area; and a processing module configured to adjust heat dissipation power of the heat dissipation area according to a temperature of a non-contact position of the housing and a measured temperature of a contact position of the housing.

According to an embodiment of a second aspect of the disclosure, there is provided a control method of an electronic device, which can be used for controlling the electronic device of the embodiment of the first aspect. The method includes: acquiring a temperature of a non-contact position of a housing of the electronic device and a temperature of a contact position of the housing; and adjusting heat dissipation power of a heat dissipation area according to the temperature of the non-contact position and the temperature of the contact position.

It should be understood that the above general description and the following detailed description are only explanatory, and are not intended to be limiting of the scope of the disclosure.

BRIEF DESCRIPTION OF THE DRAWINGS

The accompanying drawings herein, which are incorporated in the description as a constituent part of the present description, illustrate the embodiments described in the disclosure and are used, together with the description, to explain the principles of the disclosure.

DETAILED DESCRIPTION

The embodiments will be described in detail herein and examples shown in the accompanying drawings. When the following descriptions refer to the accompanying drawings, unless otherwise specified, the same numeral in different accompanying drawings denotes the same or similar element. The implementations described in the following embodiments do not denote all implementations consistent with the disclosure. On the contrary, they are merely examples of an apparatus consistent with some aspects of the disclosure as detailed in the appended claims.

Figure 1:
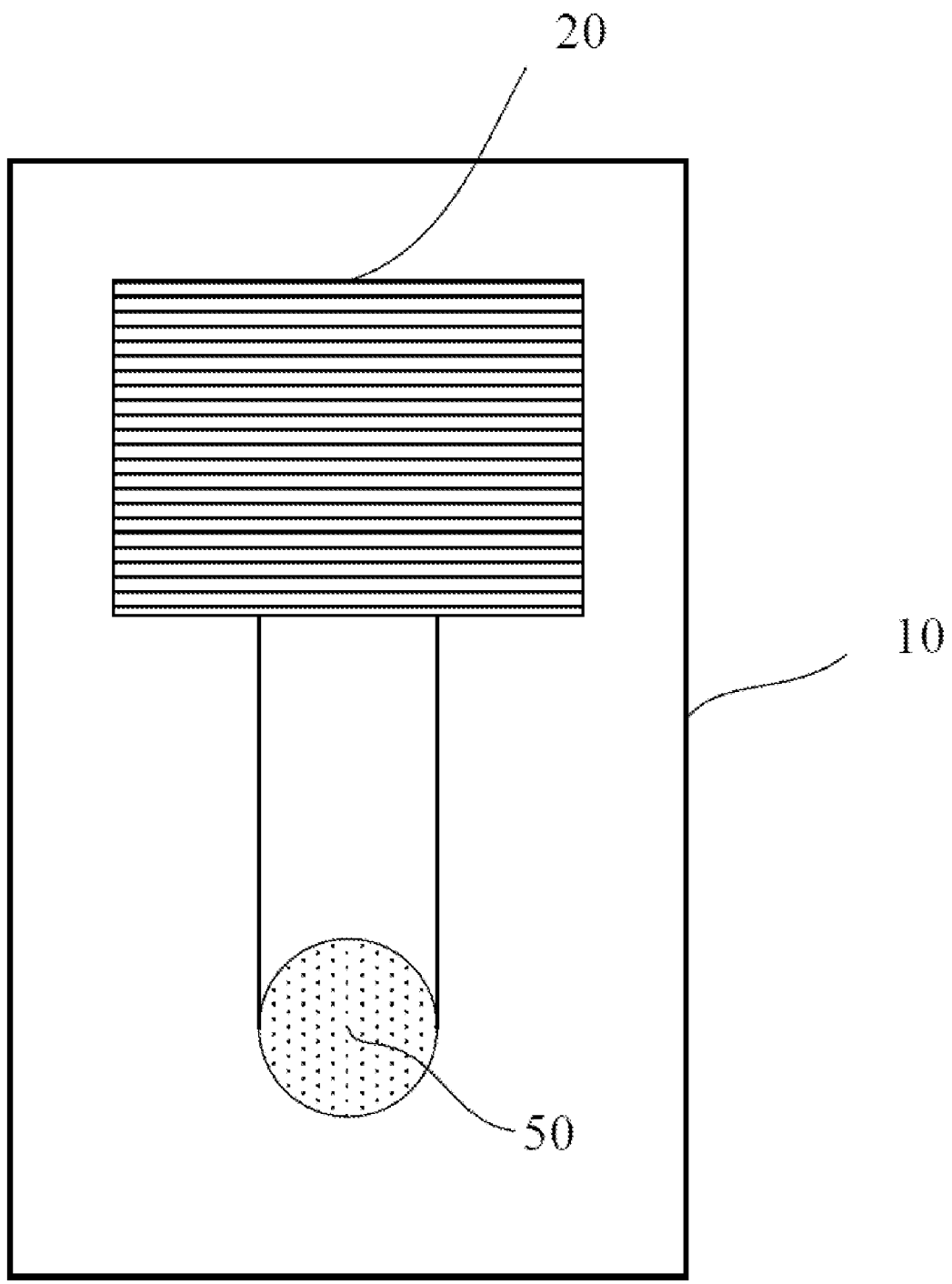
FIG. 1 is a first schematic diagram of a local structure of an electronic device according to an embodiment.
Figure 2:
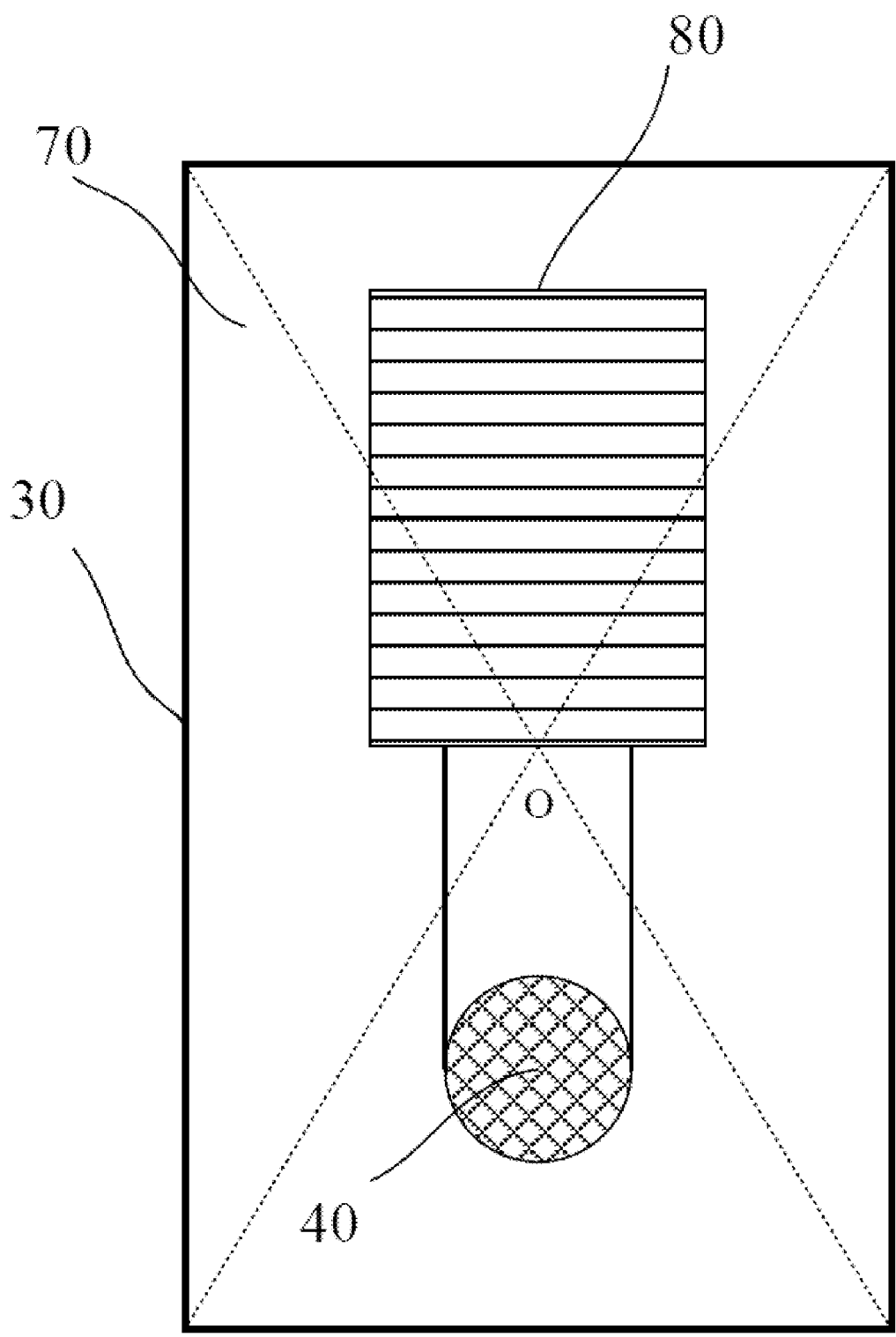
FIG. 2 is a second schematic diagram of the local structure of the electronic device according to an embodiment.

The embodiment of a first aspect of the disclosure provides an electronic device. FIG. 1 is a structural schematic diagram of a back face of the electronic device after a rear housing is removed. FIG. 2 is a structural schematic diagram of an inner side of the rear housing. The inner side of the rear housing faces the back face of the electronic device of FIG. 1.

With reference to FIGS. 1 and 2, the electronic device includes: a middle frame 10; a heat source 20 mounted on the middle frame 10; a housing 30 having a heat dissipation area 80 and a non-heat-dissipation area 70; the heat source 20 being located between the heat dissipation area 80 and the middle frame 10, and a heat dissipation coefficient of the heat dissipation area 80 being higher than that of the non-heat-dissipation area 70; and a processing module configured to adjust heat dissipation power of the heat dissipation area 80 according to a temperature of a non-contact position of the housing 30 and a measured temperature of a contact position of the housing 30.

Without limitation, the heat source 20 includes heating elements such as a processor, a memory and/or circuit board. The processing module may be a central processing unit (CPU), which may comprise one of heat sources. The middle frame 10 is capable of supporting the heat source 20.

In some embodiments, the heat dissipation area 80 is aligned with the heat source 20, or, the heat source 20 makes thermal contact with the heat dissipation area 80, thus shortening a thermal conduction path and further improving a heat dissipation capability of the heat source 20.

The electronic device includes, but is not limited to, a mobile phone, a tablet computer, a notebook computer, a television or a wearable electronic product. In some embodiments, the electronic device is a mobile phone. The mobile phone includes a display screen and a battery. The display screen and the housing 30 are mounted on two opposite surfaces of the middle frame 10 respectively, the battery is located between the rear housing and the middle frame 10, and the battery is configured to supply power to the processing module and a mainboard.

The heat dissipation area 80 and the non-heat-dissipation area 70 may be made of different materials respectively so as to achieve a higher heat dissipation effect at the heat dissipation area 80. For example, the heat dissipation area 80 may be made of a metal material, a phase change material, or like material having a similar relatively high heat dissipation coefficient. The non-heat-dissipation area 70 can be made of plastic material, glass material, or like material having a similar relatively low heat dissipation coefficient. Alternatively, part of the material of the heat dissipation area 80 can be identical to that of the non-heat-dissipation area 70, but the heat dissipation area 80 can be doped with a material having a higher thermal conductive coefficient than the thermal coefficient of the non-heat-dissipation area 70. For example, an outer wall of the heat dissipation area 80 and the non-heat-dissipation area 70 can both be made of ceramic. A phase change material, an electrically-controlled thermal conduction layer, or the like can be added into the heat dissipation area 80, thereby improving a thermal conductivity of the heat dissipation area 80 and ensuring the desired heat dissipation effect through improvement of the thermal conductivity. Furthermore, the structure of the heat dissipation area 80 of the example is advantageously conducive to improvement in integrity of the housing 30.

In an embodiment of the disclosure, the heat dissipation area 80 and the non-heat-dissipation area 70 are formed on the housing 30, and heat generated by the heat source 20 is transferred to an environment external to housing 30 at least in part through the added heat dissipation area 80, thus further improving the desired heat dissipation effect with respect to the heat source 20 and alleviating the risk that the user will experience burning hot sensation upon touching the housing 30 and/or the middle frame 10.

In an embodiment of the disclosure, the heat dissipation area 80 may be a non-contact area of the electronic device. In this specification a 'non-contact area' is an area of the electronic device that does not make direct contact with skin of a user when the electronic device is being worn by the user.

It may be understood that the added heat dissipation area 80 refers to an additional heat dissipation component that confers additional heat dissipation capability beyond that of an existing heat dissipation component in the electronic device. For example, in an embodiment of the disclosure, the middle frame 10 may be a metal or alloy middle frame 10. Thus the middle frame 10 itself can have a heat dissipation effect and may be used as a heat dissipation component to increase heat dissipation capability and achieve a certain heat dissipation effect in some use cases. Nonetheless, some practical applications will generate more heat than others. For example, if a game function is performed by the mobile device for a long period of time, heat generated by the heat source 20 may be increased relative to the heat generated by the device in less time intensive applications. In such applications, heat dissipation provided by the middle frame 10 may no longer be adequate to achieve a satisfactory effect, and both the middle frame 10 and the rear housing may become hot or burning hot to the touch. In embodiments provided herein heat dissipation area 80 adds to the heat dissipation effect and further improves the user experience by addressing a problem of a hot or even a burning hot device part when the device performs functions such is as gaming.

Without limitation, the heat dissipation area 80 and the non-heat-dissipation area 70 may be of an integral structure, that is, the heat dissipation area 80 and the non-heat-dissipation area 70 may be physically inseparable. Compared with alternative solutions in which an external heat dissipation component is added to the housing 30 in an attempt to solve the burning hot problem caused by the heat dissipation, the electronic device of the embodiment of the disclosure leverages the heat dissipation area 80, already a part of the housing 30, thereby obviating the need for an external heat dissipation component and facilitating use of the device for purposes such as gaming.

The temperature of the non-contact position may be taken as a temperature of the heat dissipation area 80 or as a temperature of the non-heat-dissipation area 70 adjacent to the heat dissipation area 80. Comparatively speaking, when the user is handling the electronic device, the non-contact position of the electronic device is farther away from the user, and the contact position of the electronic device is closer to the user. The contact position may be a position corresponding to a contact part such as a hand, a wrist, etc. of the user. Ideally, the temperature of the contact position of the electronic device, and in particular at a part of the electronic device in contact with the skin of the user, is a skin temperature of the user at the point where the user's skin contacts the electronic device when the user is handling the electronic device. The user's skin at the contact position is more exposed to the heat dissipation effect. Accordingly, in embodiments disclosed herein the temperatures of the non-contact position of the housing 30 is adjusted relative to the temperatures of the contact position of the housing 30, such that the heat dissipation power of the heat dissipation area 80 is adjusted, and the heat sensation experienced by the user due to the temperature of the electronic device is fully considered, so that accuracy of adjusting the heat dissipation power between the non-contact position and the contact position is improved, and the potential for the user to experience a burning hot sensation when handling the device is further alleviated, and a use experience of the electronic device is improved.

In some embodiments, the processing module is configured to adjust the heat dissipation power of the heat dissipation area 80 according to the temperature of the non-contact position of the housing 30, the measured temperature of the contact position of the housing 30 and a current environment temperature.

The current environment temperature refers to a temperature of an environment where the electronic device is located. This can be, e.g., a temperature in a geographic region in which the device is located, or an ambient temperature in an area, e.g., a room temperature, in which the device is used. The current environment temperature may influence the heat dissipation effect of the heat dissipation area of the device. Generally, the higher the current environment temperature, the more difficult it is for heat to dissipate into the current environment. So, in order to achieve expected heat dissipation effects, e.g., an expected effect that the rear housing will not give a burning hot sensation when a user is handling the device, the heat dissipating power is larger. On the other hand, the lower the current environment temperature, the more easily the heat is dissipated into the current environment, and thus the smaller the heat dissipation power required to achieve the desired heat dissipation effects.

Without limitation, the current environment temperature refers to the temperature of the environment in where the electronic device is located. The electronic device is capable of acquiring the current environment temperature, for example by acquiring a weather condition in an application.

Figure 4:
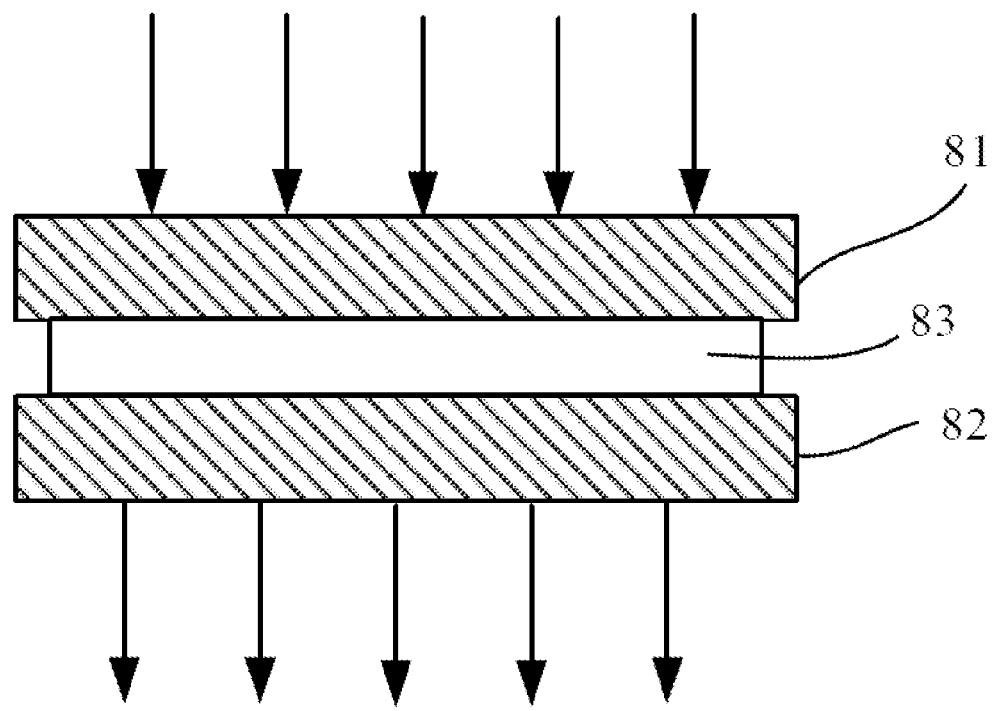
FIG. 4 is a first structural schematic diagram of a heat dissipation area according to an embodiment.

In other optional embodiments, as shown in FIG. 4, the heat dissipation area 80 includes: a first electrically insulated and thermally conductive wall 81 facing the heat source 20; a second electrically insulated and thermally conductive wall 82, the second electrically insulated and thermally conductive wall and the first electrically insulated and thermally conductive wall 81 being arranged in a stacked manner; and an electrically-controlled thermal conduction layer 83 located between the first electrically insulated and thermally conductive wall 81 and the second electrically insulated and thermally conductive wall 82, and configured to accelerate a heat conduction between the first electrically insulated and thermally conductive wall 81 and the second electrically insulated and thermally conductive wall 82 when energized.

The electrically-controlled thermal conduction layer 83 refers to a structure capable of controlling thermal conduction by means of an electrical signal. Heat transfer efficiency between the first electrically insulated and thermally conductive wall 81 and the second electrically insulated and thermally conductive wall 82 may be adjusted by adjusting effect time and/or an effect duration of the electrical signal. For example, the electrically-controlled thermal conduction layer 83 includes two different conductors, and the energy levels of charges in different conductors are different. In the case of current flow, the electrically-controlled thermal conduction layer 83 is capable of absorbing heat generated by the heat source 20 by means of the first electrically insulated and thermally conductive wall 81 and transferring the heat to the second electrically insulated and thermally conductive wall 82, so as to dissipate the heat. In this case, the first electrically insulated and thermally conductive wall 81 can form a cold end, and the second electrically insulated and thermally conductive wall 82 can form a hot end. In FIG. 4, arrows point in a direction of heat transfer. Without limitation, the heat dissipation area 80 may be a Peltier refrigeration sheet. The first electrically insulated and thermally conductive wall 81 and the second electrically insulated and thermally conductive wall 82 are both made of ceramic material or glass material.

Figure 5:
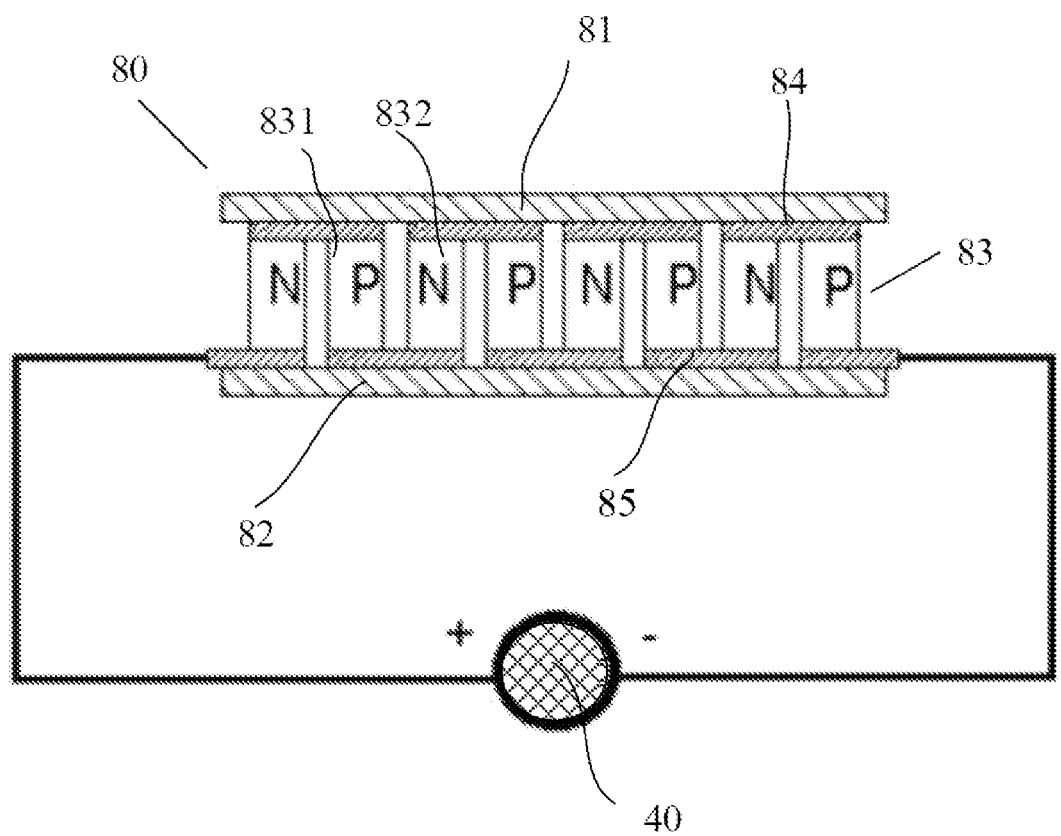
FIG. 5 is a second structural schematic diagram of the heat dissipation area shown in FIG. 4 according to an embodiment.

With reference to FIG. 5, in other optional embodiments the electrically-controlled thermal conduction layer 83 includes: thermocouples comprising first semiconductors 832 and second semiconductors 831 distributed alternately; and electrically conductive strips configured to electrically connect the first semiconductors 832 and the second semiconductors 831 (which are adjacent to each other), and the electrically conductive strips include first electrically conductive strips 84 and second electrically conductive strips 85, where the first electrically conductive strips 84 are located between the first electrically insulated and thermally conductive wall 81 and a first end of the thermocouples, and the second electrically conductive strips 85 are located between the second electrically insulated and thermally conductive wall 82 and a second end of the thermocouples, and the second end is opposite the first end.

The electrically conductive strips are electrically connected to the first semiconductors 832 and the second semiconductors 831 which are adjacent to each other. The electrically conductive strips and the thermocouples transfer heat from the first electrically insulated and thermally conductive wall 81 to the second electrically insulated and thermally conductive wall 82 in the case of current flow.

In some embodiments, the first electrically conductive strips 84, the second electrically conductive strips 85 and the thermocouples are connected in series and achieve the heat dissipation effect under the action of the electrical signal. The electrically conductive strips may be metal conductors, such as copper or aluminum. In the thermocouples, the first semiconductors 832 may be N-type semiconductors and the second semiconductors 831 may be P-type semiconductors. For example, a material of the thermocouples includes, but is not limited to, bismuth telluride.

In other optional embodiments, the electrical signal includes a pulse width modulation (PWM) signal. Parameters of the pulse width modulation signal are configured to adjust the heat dissipation power. The parameters include a frequency and/or duty cycle. In a certain frequency range, the higher the frequency of the pulse width modulation signal, the higher the heat dissipation power. In a certain duty cycle range, the higher the duty cycle, the higher the heat dissipation power.

In other optional embodiments, the first electrically insulated and thermally conductive wall 81 and an inner wall of the non-heat-dissipation area 70 are of an integral structure, and/or the second electrically insulated and thermally conductive wall 82 and an outer wall of the non-heat-dissipation area 70 are of an integral structure.

In practical use, the first electrically insulated and thermally conductive wall 81 and/or second electrically insulated and thermally conductive wall 82 may be integrated with the non-heat-dissipation area 70, and then the electrically-controlled thermal conduction layer is added between the first electrically insulated and thermally conductive wall 81 and the second electrically insulated and thermally conductive wall 82, so as to form the heat dissipation area 80. The heat dissipation area 80 is conducive to improvement in the integrity of the housing 30.

In other optional embodiments, the first electrically insulated and thermally conductive wall 81 and the non-heat-dissipation area 70 are substantially identical in material, and/or the second electrically insulated and thermally conductive wall 82 and the non-heat-dissipation area 70 are substantially identical in material. In some embodiments, the first electrically insulated and thermally conductive wall 81 and the second electrically insulated and thermally conductive wall 82 are both made of a ceramic material, and the non-heat-dissipation area 70 is also made of ceramic material. Using the substantially identical materials may further improve the integrity of the housing 30. In other optional embodiments, the heat dissipation area 80 is located at the center of the non-heat-dissipation area 70, or the heat dissipation area 80 is located above the center of the non-heat-dissipation area 70.

Generally, during use of the electronic device, the contact position is generally located between the center of the non-heat-dissipation area 70 and the bottom end of the non-heat-dissipation area 70, that is, the contact position is located below the non-heat-dissipation area 70, while the non-contact position is located at the center of the non-heat-dissipation area 70 or above the non-heat-dissipation area 70. As shown in FIG. 2, for the rectangular non-heat-dissipation area 70, an intersection of two diagonal lines of a rectangle serves as the center O of the non-heat-dissipation area 70, and the whole heat dissipation area 80 is arranged at the center of the non-heat-dissipation area 70.

Alternatively, as shown in FIG. 2, the heat dissipation area 80 is arranged above the center O of the non-heat-dissipation area 70 (wherein 'above' is toward the top of the page), and the heat dissipation area 80 may be located at the non-contact position. This arrangement provides a distribution mode of the heat dissipation area 80 that improves a touch experience during handling of the electronic device because the contact position, i.e., the point of contact with the user is far away from the heat dissipation area 80. This improves the heat dissipation effect of the heat dissipation area 80 because of reduction of shielding of the heat dissipation area 80 introduced by the user's body. FIG. 2 shows the heat dissipation area 80 substantially at the center of the non-heat-dissipation area 70.

In other optional embodiments, the electronic device further includes: a transmitting coil 50 located on the middle frame 10 and electrically connected to the processing module. The transmitting coil is configured to transmit the pulse width modulation signal; and a receiving coil 40 located on the housing 30 and electrically connected to the heat dissipation area 80, and configured to transmit the pulse width modulation signal to the heat dissipation area 80.

In an embodiment of the disclosure, the transmitting coil 50 transmits the pulse width modulation signal, and the receiving coil 40 transmits the pulse width modulation signal so as to wirelessly supply power to the heat dissipation area 80. Moreover, a power supply process includes a process of adjusting the heat dissipation power of the heat dissipation area 80. In the wireless power supply mode, the transmitting coil 50 and the receiving coil are separable components, i.e., these components can be separated from each other. When the middle frame 10 and the housing 30 are assembled, the housing 30 may be directly mounted on the middle frame 10 without a charging connection, thus reducing the number of assembly steps. Furthermore, since it is unnecessary to add a wire for supplying power to the heat dissipation area 80, reduction in occupation of space between the housing 30 and the middle frame 10 is achieved, and more expansion space is made available, which space may be reserved for a battery located between the middle frame 10 and the housing 30. As shown in FIGS. 1 and 2, the transmitting coil 50 is aligned with the receiving coil 40 so as to further improve a power supply effect on the heat dissipation area 80.

Figure 3:
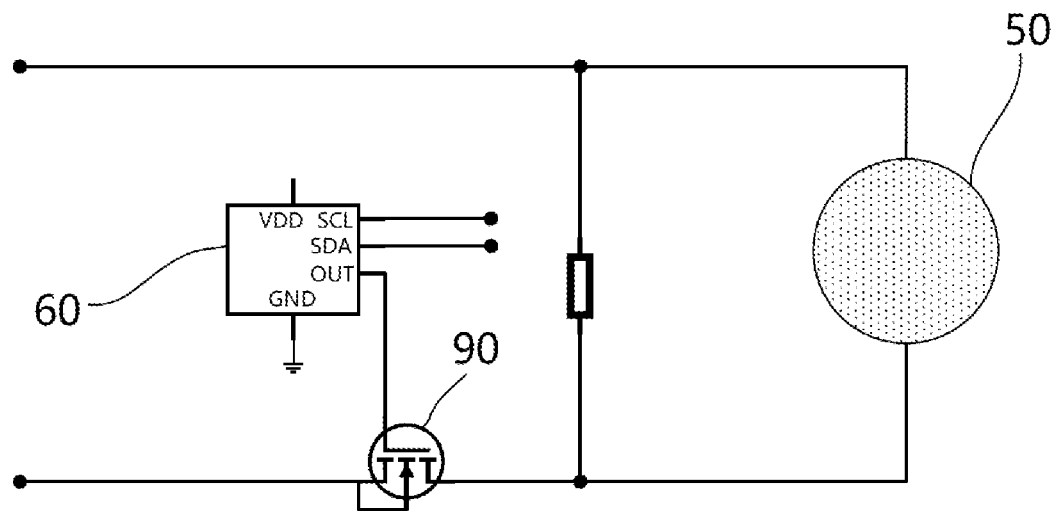
FIG. 3 is a schematic diagram showing charging by a transmitting coil of the electronic device according to an embodiment.

With reference to FIG. 3, in other optional embodiments, the electronic device further includes: a field effect transistor 90 electrically connected to the transmitting coil 50; a pulse generator 60 electrically connected to the processing module and configured to generate the pulse width modulation signal for controlling the field effect transistor 90 to be switched on or off; wherein the processing module is configured to adjust power of the heat dissipation area 80 by adjusting the frequency and/or duty cycle of the pulse width modulation signal.

In some embodiments the processing module controls the pulse generator 60 to generate the pulse width modulation signal, and the field effect transistor 90 is switched on or off under the action of the pulse width modulation signal, so that the transmitting coil 50, which is electrically connected to the field effect transistor 90, generates an electromagnetic wave based on the pulse width modulation signal, whereby the receiving coil generates an electrical signal transmitted to the heat dissipation area 80 under the action of the electromagnetic wave.

Figure 6:
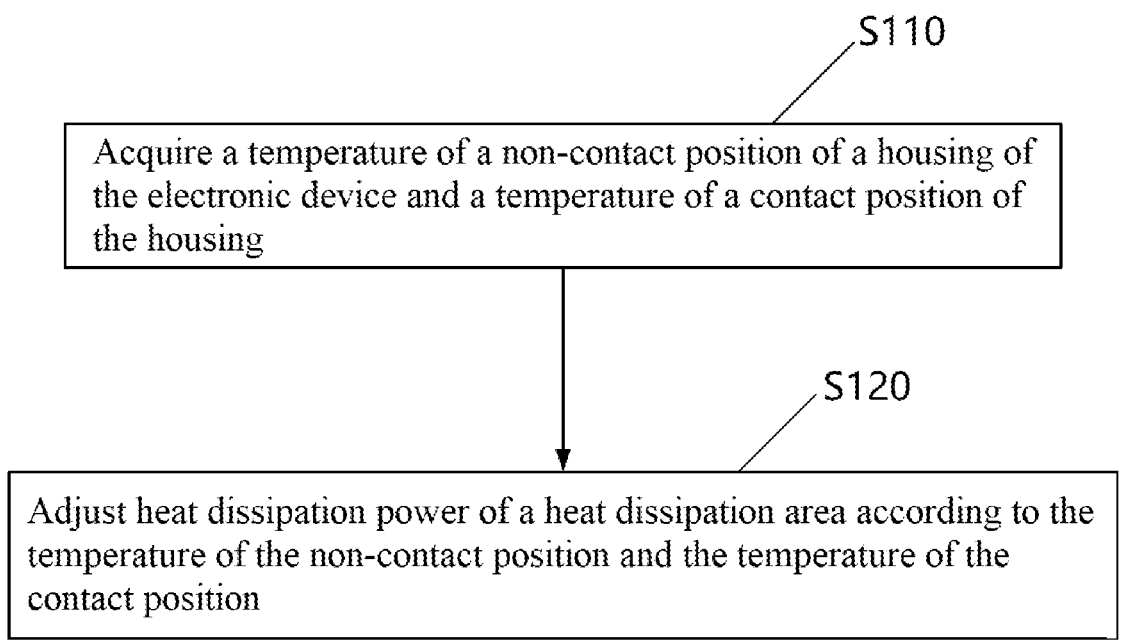
FIG. 6 is a flow diagram of a control method of the electronic device according to an embodiment.

An embodiment of a second aspect of the disclosure provides a control method for controlling an electronic device. The control method can be used for controlling the electronic device of the embodiment of the first aspect described above. As shown in FIG. 6, the method includes the following steps: at S110, acquiring a temperature of a non-contact position of a housing of the electronic device and a temperature of a contact position of the housing; and at S120, adjusting heat dissipation power of a heat dissipation area according to the temperature of the non-contact position and the temperature of the contact position. In S110, the temperature of the non-contact position may be a temperature of the heat dissipation area or a temperature of a non-heat-dissipation area adjacent to the heat dissipation area. Comparatively speaking, when the user is handling the electronic device, the non-contact position is farther away from a user, and the contact position is closer to the user. The contact position may be a position corresponding to a contact part such as a hand, a wrist, etc. of the user.

The temperature of the non-contact position and the temperature of the contact position of the housing may be individually measured by a temperature sensor of the electronic device. Alternatively, the temperature of the non-contact position and the temperature of the contact position of the housing are measured by a temperature sensor in devices other than the electronic device, and the measurements are sent to the electronic device through wireless communication. In some embodiments, the temperature of the non-contact position is measured by a temperature sensor, and the temperature sensor is located in the electronic device.

In S120, generally, the temperature of the contact position is a skin temperature of a user's contact part, as the user's skin at the area of contact is more sensitive to a heat dissipation effect. According to the temperatures of the non-contact position and the contact position of the housing, the heat dissipation power of the heat dissipation area is adjusted. The adjustment accounts for expected temperature sensation of the user when the device is worn by the user, so that accuracy of adjusting the heat dissipation power is improved, and a burning hot sensation experienced by the user is further avoided or alleviated, and a user experience when handling the electronic device is improved.

In other optional embodiments, the step of adjusting a heat dissipation power of a heat dissipation area of the device according to the temperature of the non-contact position and the temperature of the contact position includes the following steps: adjusting the heat dissipation power of a heat dissipation area of the device to be larger than or equal to a preset power of the heat dissipation area under circumstances in which a difference between the temperature of the non-contact position and the temperature of the contact position reaches a preset temperature threshold; and/or adjusting the heat dissipation power of the heat dissipation area to be smaller than the preset heat dissipation power when that difference does not reach the preset temperature threshold.

In practical use, when the difference between the temperature of the non-contact position and the temperature of the contact position is larger than the preset threshold, it means that the heat source is emitting more heat than desired, and a temperature of the housing is higher than desired, so it is desirable to increase the heat dissipation power to improve the heat dissipation effect. On the contrary, when the difference between the temperature of the non-contact position and the temperature of the contact position is smaller than the preset threshold, it means that the heat source emits less heat than expected, and the temperature of the housing is lower than expected, so it is desirable to decrease the heat dissipation power to reduce the heat dissipation effect, or alternatively to stop heat dissipation of the heat dissipation area so as to reduce power consumption. The preset threshold may be 10° C., 15° C. or 20° C., but is not limited thereto.

In some embodiments, the method further includes the following steps: receiving indication information of a current environment temperature from one or more other devices via a communication module; and adjusting the heat dissipation power of a heat dissipation area based on a temperature of the non-contact position of the housing, a measured temperature of the contact position of the housing, and the current environment temperature.

Without limitation, the current environment temperature refers to a temperature of an environment where the electronic device is located. For example, the temperature can be an ambient temperature, or a temperature in a geographic region. For example, the electronic device is capable of acquiring the current environment temperature by viewing a weather condition in an application. In another example, the application is capable of receiving the indication information of the current environment temperature from a server on a network side.

The current environment temperature can influence the heat dissipation effect experienced by the heat dissipation area. Generally, the higher the current environment temperature, the more difficult it is for heat to dissipate into a current environment. So, in order to achieve expected heat dissipation effects such as a heat dissipation effect that the rear housing is not burning hot to the touch of the user, the heat dissipation power is larger. On the other hand, the lower the current environment temperature, the easier it is to dissipate the heat into the surrounding environment, and the smaller the heat dissipation power required to achieve the expected heat dissipation effects.

In some embodiments, the step of adjusting the heat dissipation power of the heat dissipation area according to the temperature of the non-contact position of the housing, a measured temperature of the contact position of the housing and the current environment temperature includes the following step: determining that the difference between the temperature of the non-contact position and the temperature of the contact position reaches the preset threshold, or determining that the current environment temperature reaches a preset environment temperature, and adjusting the heat dissipation power of the heat dissipation area to be larger than or equal to the preset power.

Moreover, the heat dissipation power can be adjusted according to the measured temperature of the contact position of the housing and the current environment temperature, which is conducive to further improvement in the accuracy of adjusting the heat dissipation power and further improvement in the heat dissipation effect.

In an example, with the preset threshold 10° C. and the preset environment temperature 28° C., under circumstances in which the difference between the temperature of the non-contact position and the temperature of the contact position is smaller than 10° C., but in which the current environment temperature is 35° C., the heat dissipation power of the heat dissipation area is adjusted to be larger than or equal to the preset power, so as to ensure the heat dissipation effect and alleviate the potential for a burning hot situation experienced by a user contacting the housing or the middle frame.

In some embodiments, the step that adjusting the heat dissipation power of the heat dissipation area according to the temperature of the non-contact position of the housing, a measured temperature of the contact position of the housing and the current environment temperature, includes the following step: determining that the difference between the temperature of the non-contact position and the temperature of the contact position does not reach the preset threshold; determining that the current environment temperature does not reach the preset environment temperature; and adjusting the heat dissipation power of the heat dissipation area to be smaller than the preset power in response to the determining.

With the preset threshold 10° C. and the preset environment temperature 28° C. as an example, under a circumstance in which the difference between the temperature of the non-contact position and the temperature of the contact position is smaller than 10° C., and the current environment temperature is 25° C., the heat dissipation power of the heat dissipation area is adjusted to be smaller than the preset power, so as to ensure the heat dissipation effect and reduce power consumption.

In some embodiments, the step of adjusting the heat dissipation power of the heat dissipation area according to the temperature of the non-contact position of the housing, a measured temperature of the contact position of the housing and the current environment temperature, includes the following steps: determining the preset threshold according to the current environment temperature; and determining the heat dissipation power according to whether the difference between the temperature of the non-contact position and the temperature of the contact position reaches the preset threshold or not. In one embodiment, a value of the preset threshold is related to the current environment temperature, for example, the preset threshold is negatively correlated with the current environment temperature.

In other optional embodiments, the step of adjusting heat dissipation power of a heat dissipation area according to the temperature of the non-contact position and the temperature of the contact position includes the following step: adjusting the power of the heat dissipation area by adjusting a frequency and/or duty cycle of a pulse width modulation signal generated by a pulse generator, where the pulse width modulation signal is configured to control a field effect transistor to be switched on or off, and the field effect transistor is electrically connected to a transmitting coil of the electronic device.

In a certain frequency range, the higher the frequency of the pulse width modulation signal, the higher the heat dissipation power. In a certain duty cycle range, the higher the duty cycle, the higher the heat dissipation power.

As shown in FIG. 3, the processing module controls the pulse generator to generate the pulse width modulation signal, and the field effect transistor is switched on or off under the action of the pulse width modulation signal, so that the transmitting coil electrically connected to the field effect transistor generates an electromagnetic wave based on the pulse width modulation signal, and the receiving coil generates an electrical signal transmitted to the heat dissipation area under the action of the electromagnetic wave.

In other optional embodiments, the step that acquiring a temperature of a contact position of the housing includes the following steps: establishing a communication link between the electronic device and a wearable device; and acquiring the temperature of the contact position by means of the wearable device.

Compared with using the temperature sensor of the electronic device itself to measure the temperature of the contact position, using the wearable device to measure the temperature of the contact position reduces interference of the heat dissipation area with the measurement of the temperature, which is conducive to further improvement in accuracy of temperature measurement and further improvement in the accuracy of adjusting the heat dissipation power.

In some embodiments, the temperature of the contact position is the skin temperature. The skin temperature may change with change in an external environment. With the user's skin temperature detected and measured, awareness of heat dissipation of the heat dissipation area of the user may be further improved, and the accuracy of adjusting the heat dissipation power may be further improved.

Without limitation, the wearable device includes a bracelet, a watch or a ring.

Temperature differences may exist between temperatures on part of a human body and temperatures in other parts of the human body. These differences can be large. Accordingly, for hand-operated electronic devices such as a mobile phone, a tablet computer or a television, the skin temperature measured by a bracelet, watch or ring is closer to that of a user's hand, and a heat generation amount of the bracelet, watch or ring is very small, thus improving the accuracy of the temperature measurement of the contact position.

In another particular example, the electronic device is a mobile phone. In that example, FIGS. 1-5 are applicable to illustrate embodiments in which a skin temperature of the user's hand is measured by a bracelet, that is, a temperature T1 of a contact position between the bracelet and a wrist of the user is measured by a temperature sensor in the bracelet. A temperature of the housing is measured by a temperature sensor of the mobile phone itself, which may be recorded as T2. T3=T2−T1 corresponds to a temperature rise that occurs when the user's hand touches the mobile phone. When T3 exceeds a certain value (the preset threshold), it may be determined that the mobile phone generates too much heat and from that it may be inferred that the temperature of the mobile phone exceeds a temperature that would be a comfortable touch temperature for the user's hand. The mobile phone may adjust the heat dissipation of the heat dissipation area through the following procedure, so as to improve the touch experience of the user when handling the mobile phone.

When T3 reaches the preset threshold, a CPU (that is, a processing module or processor) may ask the pulse generator in FIG. 3 to start to generate the PWM signal to control a metal-oxide-semiconductor field-effect transistor (MOSFET) (that is, the field effect transistor 90) to be switched on and off. The transmitting coil may generate the electromagnetic wave according to the PWM signal, and the receiving coil may generate electricity by means of a corresponding changing magnetic field, thus supplying power to the heat dissipation area shown in FIG. 5. A cold end of the heat dissipation area faces a mainboard (the heat source), and a hot end faces the external environment of a mobile phone body, so that heat generated by the mainboard may be concentrated and dissipated by means of the heat dissipation area, thus reducing heat of other parts of the mobile phone body and improving overall touch experience for the user, without reducing performance of the mobile phone. In FIG. 3, the pulse generator 60 is electrically connected to the field effect transistor 90 by means of an output terminal (OUT). In addition to the output terminal, the pulse generator 60 also includes a ground terminal (GND), a drain power voltage terminal (VDD), a serial clock signal terminal (SCL) and a port for data transmission (SDA).

In the example, an external cooling device may be removed from the mobile phone, and intelligent temperature control may be achieved by determining a contact temperature difference between the housing of the mobile phone and the user's hand, so that the user may experience a more comfortable contact temperature when using the mobile phone, without degrading the performance of the mobile phone.

Figure 7:
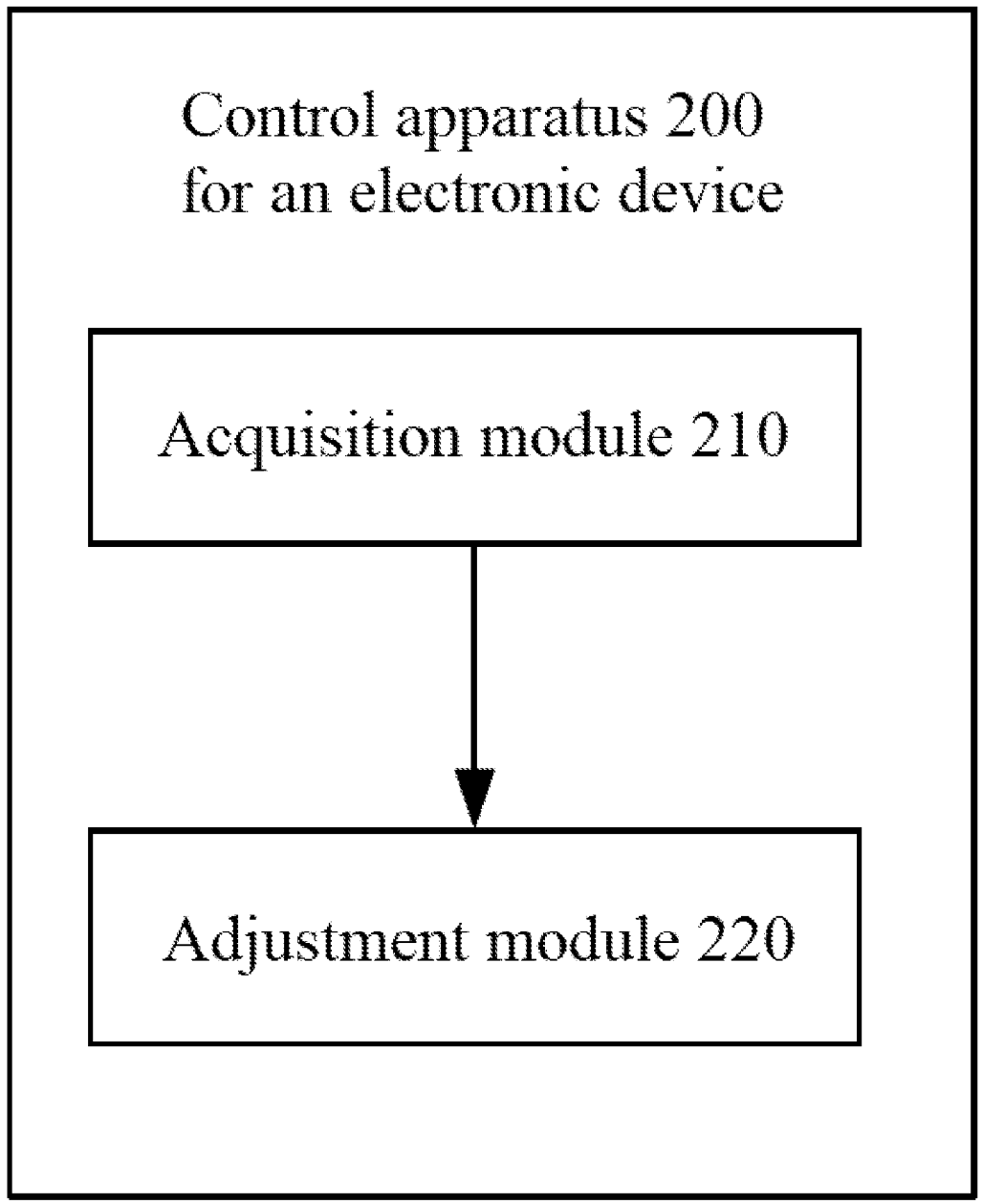
FIG. 7 is a structural schematic diagram of a control apparatus for the electronic device according to an embodiment.

An embodiment of a third aspect of the disclosure provides a control apparatus for an electronic device, which can be used to control the electronic device of the embodiment of the first aspect. As shown in FIG. 7, the apparatus 200 includes: an acquisition module 210, configured to acquire a temperature of a non-contact position of a housing of the electronic device and a temperature of a contact position of the housing; and an adjustment module 220, configured to adjust heat dissipation power of the heat dissipation area according to the temperature of the non-contact position and the temperature of the contact position.

In other optional embodiments, the adjustment module is further configured to: adjust the heat dissipation power of the heat dissipation area to be larger than or equal to preset power under a circumstance in which a difference between the temperature of the non-contact position and the temperature of the contact position reaches a preset threshold; and/or adjust the heat dissipation power of the heat dissipation area to be smaller than the preset power under a circumstance in which the difference does not reach the preset threshold.

In other optional embodiments, the adjustment module is configured to: adjust the heat dissipation power of the heat dissipation area based on the temperature of the non-contact position of the housing, a measured temperature of the contact position of the housing and the current environment temperature.

Without limitation, the current environment temperature refers to a temperature of an environment where the electronic device is located and can also refer to an ambient temperature. The electronic device is capable of acquiring the current environment, and/or ambient temperature by viewing a weather condition in an application.

The current environment and/or ambient temperature may influence a heat dissipation effect of the heat dissipation area. Generally, the higher the current surrounding environment temperature, the more difficult it is for heat to dissipate into the current surrounding environment. So, in order to achieve expected heat dissipation effects such as an effect that the rear housing is not burning hot to the touch of a user, the heat dissipation power is larger. On the other hand, the lower the current environment temperature, the easier it is to dissipate the heat into the current surrounding environment. So, the smaller is the heat dissipation power required to achieve the expected heat dissipation effects.

In some embodiments, the adjustment module is further configured to: determine that the difference between the temperature of the non-contact position and the temperature of the contact position has reached the preset threshold, or determine that the current environment temperature reaches a preset environment temperature, and adjust the heat dissipation power of the heat dissipation area to be larger than or equal to the preset power.

Moreover, the heat dissipation power is adjusted according to the measured temperature of the contact position of the housing and the current environment temperature, which is conducive to further improvement in accuracy of adjusting the heat dissipation power and further improvement in the heat dissipation effect.

With the preset threshold 10° C. and the preset environment temperature 28° C. as an example, under a circumstance in which the difference between the temperature of the non-contact position and the temperature of the contact position is smaller than 10° C., but the current environment temperature is 35° C., the heat dissipation power of the heat dissipation area is adjusted to be larger than or equal to the preset power, so as to ensure the heat dissipation effect is achieved, thereby reducing a possibility that user experiences a burning hot sensation when the user contacts the housing or the middle frame.

In some embodiments, the adjustment module is further configured to: determine that the difference between the temperature of the non-contact position and the temperature of the contact position does not reach the preset threshold, determine that the current environment temperature does not reach the preset environment temperature, and adjust the heat dissipation power of the heat dissipation area to be smaller than the preset power.

With the preset threshold 10° C. and the preset environment temperature 28° C. as an example, under the condition that the difference between the temperature of the non-contact position and the temperature of the contact position is smaller than 10° C., and the current environment temperature is 25° C., the heat dissipation power of the heat dissipation area is adjusted to be smaller than the preset power, so as to ensure the heat dissipation effect is achieved and to reduce power consumption.

In some embodiments, the adjustment module is further configured to: determine the preset threshold according to the current environment temperature; and determine the heat dissipation power according to whether the difference between the temperature of the non-contact position and the temperature of the contact position reaches the preset threshold or not. In an embodiment, a value of the preset threshold is related to the current environment temperature, for example, the preset threshold is negatively correlated with the current environment temperature.

In other optional embodiments, the adjustment module is further configured to: adjust power of the heat dissipation area by adjusting a frequency and/or duty cycle of a pulse width modulation signal generated by a pulse generator, where the pulse width modulation signal is configured to control a field effect transistor to be switched on or off, and the field effect transistor is electrically connected to a transmitting coil of the electronic device.

In other optional embodiments, the acquisition module is further configured to: establish a communication link between the electronic device and a wearable device; and acquire the temperature of the contact position by means of the wearable device. In some embodiments, the wearable device includes a bracelet, a watch or a ring.

An embodiment of the third aspect of the disclosure provides an electronic device, which includes: a processor, and a memory for storing processor-executable instructions that configure a processor to execute the steps of the method of the embodiment of the second aspect described above.

An embodiment of a fourth aspect of the disclosure provides a computer-readable storage medium, which stores a computer program comprising processor-executable instructions. The instructions, when executed by a processor of an electronic device, configure the electronic device to execute the steps of the method of the embodiment of the second aspect described above.

In the embodiments, a plurality of modules, etc. in a control apparatus for an electronic device may be implemented by one or more of a central processing unit (CPU), a graphics processing unit (GPU), a baseband processor (BP), an application specific integrated circuit (ASIC), a digital signal processor (DSP), a programmable logic device (PLD), a complex programmable logic device (CPLD), a field-programmable gate array (FPGA), a general-purpose processor, a controller and a micro controller unit (MCU), a microprocessor, or other electronic components, thus executing the above-mentioned method.

Figure 8:
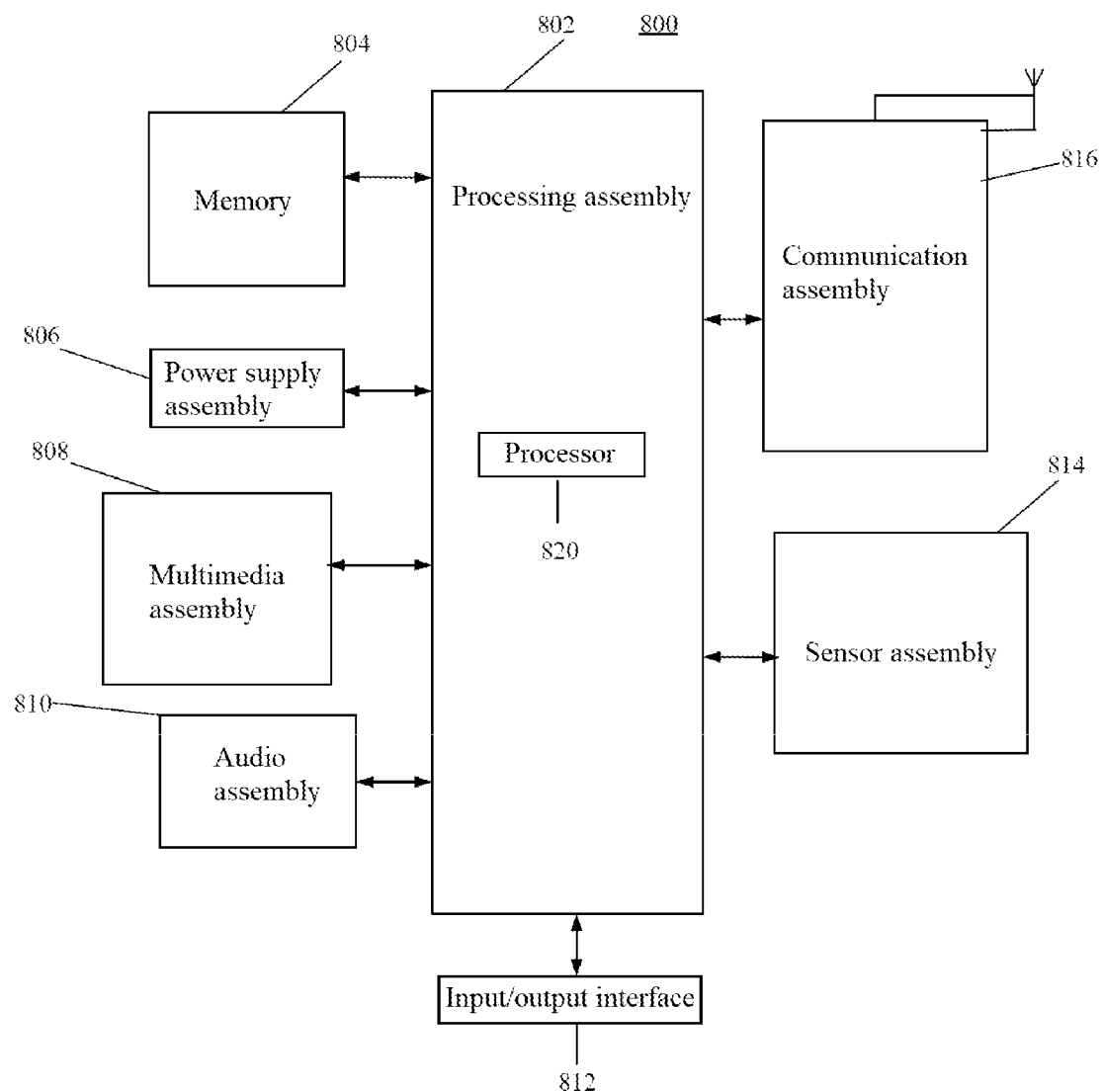
FIG. 8 is a structural block diagram of composition of a control apparatus for the electronic device according to an embodiment.

FIG. 8 is a block diagram of a control apparatus 800 for an electronic device according to an embodiment. For example, the apparatus 800 may be a mobile phone, a computer, a digital broadcast terminal, a messaging device, a game console, a tablet device, a medical device, a fitness device, a personal digital assistant, etc.

With reference to FIG. 8, the apparatus 800 may include one or more of the following assemblies: a processing assembly 802, a memory 804, a power supply assembly 806, a multimedia assembly 808, an audio assembly 810, an input/output (I/O) interface 812, a sensor assembly 814, and a communication assembly 816.

The processing assembly 802 generally controls all operations of the apparatus 800, such as operations associated with display, telephone call, data communication, camera operation and recording operation. The processing assembly 802 may include one or more processors 820 to execute instructions, so as to perform all or part of the steps of the above-mentioned method. In addition, the processing assembly 802 may include one or more modules to facilitate interactions between the processing assembly 802 and other assemblies. For example, the processing assembly 802 may include a multimedia module to facilitate the interaction between the multimedia assembly 808 and the processing assembly 802.

The memory 804 is configured to store various types of instructions and/or data to support the operations on the apparatus 800. Examples include an instruction for any application or method operating on the apparatus 800, contact data, phone book data, a message, a picture, a video, etc. The memory 804 may be achieved by any type of volatile or nonvolatile memory device or their combination, such as a static random access memory (SRAM), an electrically erasable programmable read only memory (EEPROM), an erasable programmable read only memory (EPROM), a programmable read only memory (PROM), a read only memory (ROM), a magnetic memory, a flash memory, a magnetic disk or an optical disk.

The power supply assembly 806 supplies power to various assemblies of the apparatus 800. The power supply assembly 806 may include a power management system, one or more power supplies, and other assemblies associated with generating, managing and distributing power for the apparatus 800.

The multimedia assembly 808 includes a screen that provides an output interface between the apparatus 800 and the user. In some embodiments, the screen may include a liquid crystal display (LCD) and a touch panel (TP). If the screen includes the touch panel, the screen may be implemented as a touch screen to receive an input signal from the user. The touch panel includes one or more touch sensors to sense touching, sliding and gestures on the touch panel. The touch sensor may sense a boundary of a touching or sliding operation, and detect a duration and pressure related to the touching or sliding operation. In some embodiments, the multimedia assembly 808 includes a front camera and/or a back camera. When the apparatus 800 is in an operation mode, such as a shooting mode or a video mode, the front camera and/or the back camera are/is capable of receiving external multimedia data. Each of the front camera and back camera may be a fixed optical lens system or have a focal length and optical zoom capability.

The audio assembly 810 is configured to output and/or input an audio signal. For example, the audio assembly 810 includes a microphone (MIC). The microphone is configured to receive an external audio signal when the apparatus 800 is in operation modes such as a call mode, a recording mode and a voice recognition mode. The received audio signal may be further stored in the memory 804 or sent via the communication assembly 816. In some embodiments, the audio assembly 810 further includes a speaker for outputting an audio signal.

The I/O interface 812 provides an interface between the processing assembly 802 and a peripheral interface module. The peripheral interface module may be a keyboard, a click wheel, a button, etc. The buttons may include, but are not limited to, a home button, a volume button, a start button and a lock button.

The sensor assembly 814 includes one or more sensors for providing various aspects of state assessment for the apparatus 800. For example, the sensor assembly 814 is capable of detecting an on/off state of the apparatus 800 and relative positioning of the assemblies such as a display and a keypad of the apparatus 800, and the sensor assembly 814 is further capable of detecting position change of the apparatus 800 or an assembly of the apparatus 800, presence or absence of contact between a user and the apparatus 800, an orientation or acceleration/deceleration of the apparatus 800 and temperature change of the apparatus 800. The sensor assembly 814 may include a proximity sensor configured to detect presence of a nearby object without any physical contact. The sensor assembly 814 may further include an optical sensor, such as a complementary metal-oxide-semiconductor (CMOS) or charge-coupled device (CCD) image sensor, which is used in imaging applications. In some embodiments, the sensor assembly 814 may further include an acceleration sensor, a gyroscope sensor, a magnetic sensor, a pressure sensor or a temperature sensor.

The communication assembly 816 is configured to facilitate wired or wireless communication between the apparatus 800 and other devices. The apparatus 800 may access a wireless network based on a communication standard, such as WiFi, the 4th generation mobile communication technology (4G) or the 5th generation mobile communication technology (5G), or their combination. In an embodiment, the communication assembly 816 receives a broadcast signal or broadcast related information from an external broadcast management system via a broadcast channel. In an embodiment, the communication assembly 816 further includes a near field communication (NFC) module to facilitate short-range communication. For example, the NFC module may be implemented on the basis of a radio frequency identification (RFID) technology, an infrared data association (IrDA) technology, an ultra wide band (UWB) technology, a Bluetooth (BT) technology and other technologies.

In the embodiments, the apparatus 800 may be implemented by one or more of an application specific integrated circuit (ASIC), a digital signal processor (DSP), a digital signal processing device (DSPD), a programmable logic device (PLD), a field-programmable gate array (FPGA), a controller, a micro controller unit, a microprocessor or other electronic components, thus executing the above-mentioned method.

In the embodiments, there is further provided a non-transitory computer-readable storage medium including processor-executable instructions, such as the memory 804 including instructions. The instructions may be executed by the processor 820 of the apparatus 800 so as to carry out the above-mentioned method. For example, the non-transitory computer-readable storage medium may be ROM, a random access memory (RAM), CD-ROM, a magnetic tape, a floppy disk, an optical data storage device, etc.

The methods disclosed in the several method embodiments provided in the disclosure may be combined to thereby derive additional methods within the scope of the disclosure.

The features disclosed in the several device embodiments provided in the disclosure may be arbitrarily combined to obtain a new product embodiment within the scope of the disclosure.

The features disclosed in the several method or device embodiments provided in the disclosure may be combined to obtain additional methods or embodiments or products within the scope of the disclosure.

Those skilled in the art could easily conceive of other implementation solutions of the disclosure upon consideration of the description and the invention disclosed herein. The disclosure is intended to cover any variations, uses or adaptive changes of the disclosure, which follow the general principles of the disclosure and include common general knowledge or conventional technical means, which are not necessarily disclosed in the disclosure.

It should be understood that the disclosure is not limited to the particular structures described herein and illustrated in the accompanying drawings, and instead can have various modifications and changes without departing from the its scope. The scope of the disclosure is limited by the appended claims only.

What is claimed is:

1. An electronic device, comprising:
a middle frame;
a heat source mounted on the middle frame;
a housing having a heat dissipation area and a non-heat-dissipation area, the heat source being located between the heat dissipation area and the middle frame, a heat dissipation coefficient of the heat dissipation area being higher than that of the non-heat-dissipation area; and
a processing module configured to adjust heat dissipation power of the heat dissipation area according to a temperature of a non-contact position of the housing and a measured temperature of a contact position of the housing;
wherein the heat dissipation area comprises:
a first electrically insulated and thermally conductive wall facing the heat source;
a second electrically insulated and thermally conductive wall, the second electrically insulated and thermally conductive wall and the first electrically insulated and thermally conductive wall being arranged in a stacked manner; and
an electrically-controlled thermal conduction layer located between the first electrically insulated and thermally conductive wall and the second electrically insulated and thermally conductive wall, and configured to accelerate a heat conduction between the first electrically insulated and thermally conductive wall and the second electrically insulated and thermally conductive wall when energized.

2. The electronic device according to claim 1, wherein the electrically-controlled thermal conduction layer comprises:
thermocouples comprising first semiconductors and second semiconductors distributed alternately; and
electrically conductive strips configured to electrically connect the first semiconductors and the second semiconductors which are adjacent to each other, wherein the electrically conductive strips comprise first electrically conductive strips and second electrically conductive strips, wherein the first electrically conductive strips are located between the first electrically insulated and thermally conductive wall and a first end of the thermocouples, the second electrically conductive strips are located between the second electrically insulated and thermally conductive wall and a second end of the thermocouples, and the second end is opposite to the first end; and wherein the electrically conductive strips and the thermocouples transfer heat from the first electrically insulated and thermally conductive wall to the second electrically insulated and thermally conductive wall in a case of current flow.

3. The electronic device according to claim 1, wherein:
the electrically-controlled thermal conduction layer is controlled using an electrical signal that comprises a pulse width modulation signal; and
parameters of the pulse width modulation signal are configured to adjust the heat dissipation power, wherein the parameters comprise a frequency or duty cycle.

4. The electronic device according to claim 1, wherein:
the electrically-controlled thermal conduction layer is controlled using an electrical signal that comprises a pulse width modulation signal; and
parameters of the pulse width modulation signal are configured to adjust the heat dissipation power, wherein the parameters comprise a frequency and duty cycle.

5. The electronic device according to claim 1, wherein the first electrically insulated and thermally conductive wall and an inner wall of the non-heat-dissipation area are of an integral structure, or the second electrically insulated and thermally conductive wall and an outer wall of the non-heat-dissipation area are of an integral structure.

6. The electronic device according to claim 1, wherein the first electrically insulated and thermally conductive wall and an inner wall of the non-heat-dissipation area are of an integral structure, and the second electrically insulated and thermally conductive wall and an outer wall of the non-heat-dissipation area are of an integral structure.

7. The electronic device according to claim 1, wherein the first electrically insulated and thermally conductive wall and the non-heat-dissipation area are substantially identical in material, or the second electrically insulated and thermally conductive wall and the non-heat-dissipation area are substantially identical in material.

8. The electronic device according to claim 1, wherein the first electrically insulated and thermally conductive wall and the non-heat-dissipation area are substantially identical in material, and the second electrically insulated and thermally conductive wall and the non-heat-dissipation area are substantially identical in material.

9. The electronic device according to claim 1, wherein the heat dissipation area is located at about a center of the non-heat-dissipation area, or the heat dissipation area is located above an approximate center of the non-heat-dissipation area.

10. The electronic device according to claim 3, further comprising:
a transmitting coil located on the middle frame, electrically connected to the processing module, and configured to transmit the pulse width modulation signal; and
a receiving coil located on the housing, electrically connected to the heat dissipation area, and configured to transmit the pulse width modulation signal to the heat dissipation area.

11. The electronic device according to claim 10, further comprising:
a field effect transistor electrically connected to the transmitting coil;
a pulse generator electrically connected to the processing module and configured to generate the pulse width modulation signal for controlling the field effect transistor to be switched on and off; and
wherein the processing module is configured to adjust power of the heat dissipation area by adjusting the frequency or duty cycle of the pulse width modulation signal.

12. The electronic device according to claim 10, further comprising:
a field effect transistor electrically connected to the transmitting coil;
a pulse generator electrically connected to the processing module and configured to generate the pulse width modulation signal for controlling the field effect transistor to be switched on and off; and
wherein the processing module is configured to adjust power of the heat dissipation area by adjusting the frequency and duty cycle of the pulse width modulation signal.

13. A method for controlling the electronic device of claim 1, the method comprising:
acquiring the temperature of the non-contact position of the housing of the electronic device and a temperature of the contact position of the housing; and
adjusting heat dissipation power of the heat dissipation area according to the temperature of the non-contact position and the temperature of the contact position.

14. The method according to claim 13, wherein adjusting the heat dissipation power of the heat dissipation area according to the temperature of the non-contact position and the temperature of the contact position comprises:
adjusting the heat dissipation power of the heat dissipation area to be larger than or equal to a preset power under a condition that a difference between the temperature of the non-contact position and the temperature of the contact position reaches a preset threshold, or
adjusting the heat dissipation power of the heat dissipation area to be smaller than the preset power under the condition that the difference between the temperature of the non-contact position and the temperature of the contact position does not reach the preset threshold.

15. The method according to claim 13, wherein adjusting the heat dissipation power of the heat dissipation area according to the temperature of the non-contact position and the temperature of the contact position comprises:
adjusting the heat dissipation power of the heat dissipation area to be larger than or equal to a preset power under a condition that a difference between the temperature of the non-contact position and the temperature of the contact position reaches a preset threshold, and
adjusting the heat dissipation power of the heat dissipation area to be smaller than the preset power under the condition that the difference between the temperature of the non-contact position and the temperature of the contact position does not reach the preset threshold.

16. The method according to claim 13, wherein adjusting the heat dissipation power of the heat dissipation area comprises:
adjusting power of the heat dissipation area by adjusting a frequency or duty cycle of a pulse width modulation signal generated by a pulse generator, wherein the pulse width modulation signal is configured to control a field effect transistor to be switched on and off, and the field effect transistor is electrically connected to a transmitting coil of the electronic device.

17. The method according to claim 13, wherein adjusting the heat dissipation power of the heat dissipation area comprises:
adjusting power of the heat dissipation area by adjusting a frequency and duty cycle of a pulse width modulation signal generated by a pulse generator, wherein the pulse width modulation signal is configured to control a field effect transistor to be switched on and off, and the field effect transistor is electrically connected to a transmitting coil of the electronic device.

18. The method according to claim 13, wherein acquiring the temperature of the contact position of the housing comprises:
establishing a communication link between the electronic device and a wearable device; and
acquiring the temperature of the contact position by means of the wearable device.

19. The method according to claim 18, wherein the wearable device comprises a bracelet, a watch or a ring.

* * * * *

UNITED STATES PATENT AND TRADEMARK OFFICE
CERTIFICATE OF CORRECTION

| | | |
|---|---|---|
| PATENT NO. | : 12,213,283 B2 | Page 1 of 1 |
| APPLICATION NO. | : 17/587986 | |
| DATED | : January 28, 2025 | |
| INVENTOR(S) | : Ruifu Yang | |

It is certified that error appears in the above-identified patent and that said Letters Patent is hereby corrected as shown below:

In the Specification

In Column 4, Line 3, delete "such is" and insert -- such --, therefor.

In Column 5, Line 5, delete "where" and insert -- which --, therefor.

In Column 14, Line 64, delete "are/is" and insert -- is/are --, therefor.

In Column 16, Line 27, delete "the its" and insert -- its --, therefor.

Signed and Sealed this
Twenty-sixth Day of August, 2025

Coke Morgan Stewart
*Acting Director of the United States Patent and Trademark Office*